United States Patent [19]

Simpson

[11] Patent Number: 4,558,232

[45] Date of Patent: Dec. 10, 1985

[54] LEVEL DETECTOR CIRCUIT FOR MICROCOMPUTER DEVICES

[76] Inventor: Richard D. Simpson, 7930 Corporate Dr., #66, Houston, Tex. 77036

[21] Appl. No.: 350,958

[22] Filed: Feb. 22, 1982

[51] Int. Cl.[4] .................. H03K 5/153; H03K 5/24
[52] U.S. Cl. .................. 307/351; 307/279; 307/362; 307/354
[58] Field of Search .......... 307/350, 351, 352, 362, 307/246, 247 R, 279; 328/147, 146

[56] References Cited

U.S. PATENT DOCUMENTS

| | | | |
|---|---|---|---|
| 3,041,477 | 6/1962 | Budts et al. | 307/291 |
| 3,446,989 | 5/1969 | Allen et al. | 307/247 R |
| 3,513,400 | 5/1970 | Russell | 328/146 |
| 3,614,476 | 10/1971 | Teranishi | 307/247 R |
| 3,693,028 | 9/1972 | Fussell | 307/247 R |
| 3,953,746 | 4/1976 | Fett | 307/247 R |
| 4,045,686 | 8/1977 | Masuda | 328/146 |
| 4,408,133 | 10/1983 | Cooperman et al. | 328/146 |
| 4,461,964 | 7/1984 | Shiatari | 307/279 |

Primary Examiner—Stanley D. Miller
Assistant Examiner—Timothy P. Callahan

[57] ABSTRACT

An overvoltage detector circuit for connection to an input terminal of a microcomputer device or the like employs a bistable latch with two inputs, one connected to a reference potential and the other to the input terminal. When the inputs are gated, the latch flips to one state if the terminal is at an overvoltage, or the other state if the terminal is at zero or logic-1. This circuit may be used to institute a test mode for the microcomputer.

7 Claims, 7 Drawing Figures

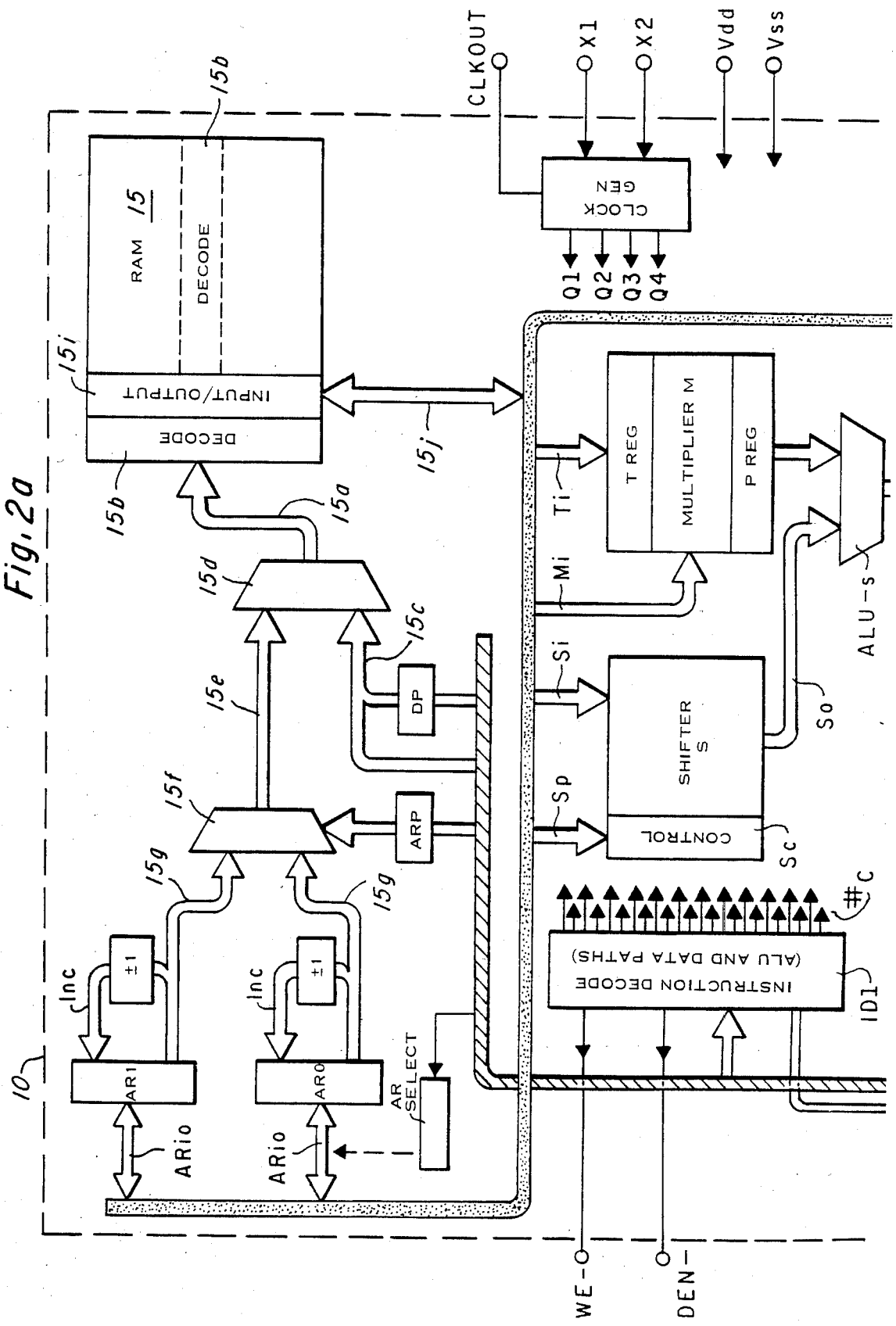

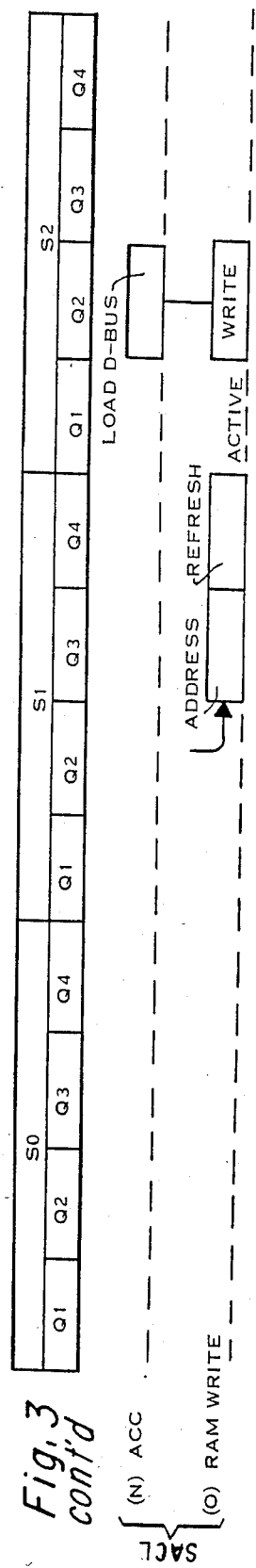

LEVEL DETECTOR CIRCUIT FOR MICROCOMPUTER DEVICES

BACKGROUND OF THE INVENTION

This invention relates to integrated semiconductor devices and systems, and more particularly to features of a level detector circuit for use as an over-voltage detector to initiate a test mode in a high-speed, miniaturized, electronic digital signal processing system in single-chip microcomputer form.

It is the principal object to this invention to provide improved features of a level detector circuit for initiating a test mode of operation in a semiconductor device such as, for example, a microcomputer device and system, particularly one adapted for real-time digital signal processing or the like. Another object is to provide a level detector for use in a high-speed microcomputer of enhanced capabilities.

SUMMARY OF THE INVENTION

In accordance with one embodiment, an overvoltage detector circuit for connection to an input terminal of a microcomputer device or the like employs a bistable latch with two inputs, one connected to a reference potential and the other to the input terminal. When the inputs are gated, the latch flips to one state if the terminal is at zero or logic-1. This circuit may be used to initiate a test mode for the microcomputer.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein;

FIGS. 2a and 2b are is an electrical diagram in block form of an MOS/LSI microcomputer device (including a CPU or central processor unit) employed in the system of FIG. 1 and utilizing features of the invention;

DETAILED DESCRIPTION OF SPECIFIC EMBODIMENT

Microprocessor System

Figure 1:
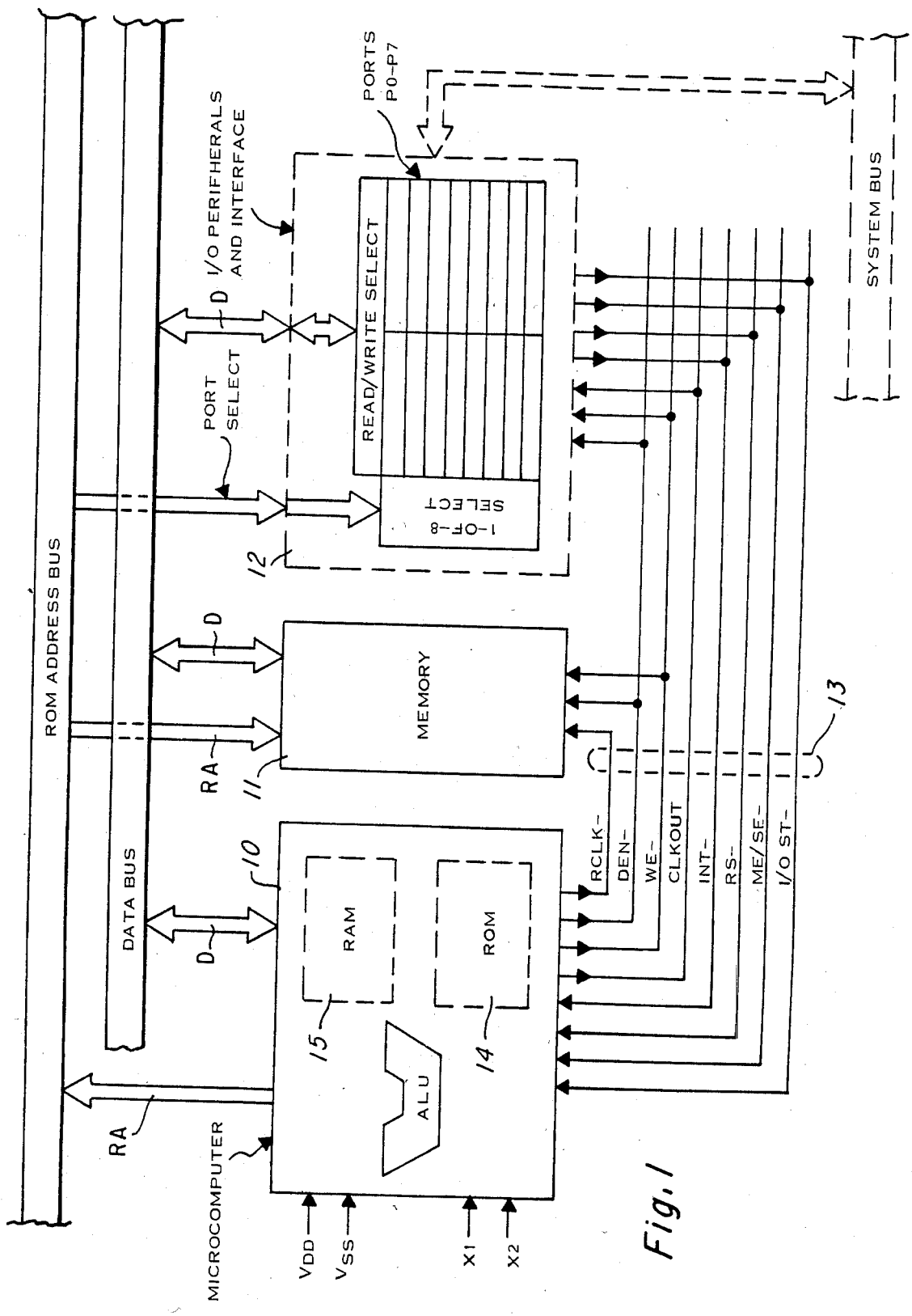
FIG. 1 is an electrical diagram in block form of a microcomputer system employing features of the invention in a control circuit for a test mode.

The microcomputer device to be described herein is primarily used for signal processing, but concepts thereof may be used in processor devices for various configurations, and these devices may be used in many different systems; in one embodiment the microcomputer is used in a system shown in generalllized form in FIG. 1. The system may be, for example, a voice communication system, a speech analysis system, a small "personal" or "home" computer, a single-board general purpose microcomputer, a word processing system, a computer terminal having local processing capability with display and typewriter keyboard, or any one of many applications of various types. The system includes a single-chip MOS/LSI central processing unit or microcomputer 10 which will be described in detail, along with a program or data memory 11 and input/output or I/O devices 12. Usually the I/O devices 12 for the typical system include analog-to-digital and/or digital-to-analog converters, a modem, a keyboard, a CRT diaplay, a disc drive, etc. Often the I/O 12 includes coupling to a general purpose processor; that is, the microcomputer 10 is an attached processor in a larger system with interface via the I/O 12. The microcomputer 10, program data memory 11 and I/O 12 communicates with one another by two multibit, parallel address and data busses, D and RA, along with a control bus 13. The microcomputer 10 has suitable supply voltage and crystal-input terminals; for example, the device employs a single +5 V Vdd supply and ground or Vss, and a crystal is connected to terminals X1 and X2 of the device 10 to control certain system timing. The microcomputer 10 is a very high speed device with a crystal input of 20 MHz, providing an instruction execution rate of five million per second, in one embodiment.

The microcomputer device 10 is a general purpose microcomputer specifically aimed at serving a large class of serial signal processing problems such as digital filtering, signal handling for telecommunications modems (modulation, demodulation), data compression for linear predictive code (LPC) speech signals, fast Fourier transforms, and in general for virtually all computation intensive analog system functions, including detection, signal generation, mixing, phase tracking, angle measurement, feedback control, clock recovery, correlation, convolution, etc. It is suitable for applications which have computational requirements similar to those for control and signal processing, such as coordinate transformation, solution of linear differential equations with constant coefficients, averaging, etc. The device 10 is usually interfaced via I/O 12 to a general purpose processor such as a 99000, an 8600 or a 68000, to construct processing systems as will be explained.

It is understood that, even though described in the context of a microcomputer in the preferred embodiment, with an on-chip program ROM 14 and data RAM 15, nevertheless some concepts of the invention may be used in a single-chip microprocessor with all off-chip program memory and/or data memory instead of the on-chip memory illustrated. Indeed, modes of operation are provided which disable the on-chip memory. Also, a microcomputer is shown having two separate external program address and data busses instead of the multiplexed, bidirectional busses which are now common, but some features herein disclosed are applicable where busses are multiplexed. The advantage of separating the busses and separating program and data memory space is speed.

In general terms, the system of FIG. 1 functions in the following manner: the microcomputer 10 fetches an instruction word internally by accessing the ROM 14 or externally by sending out an address on the ROM address bus RA to the memory 11 (and RCLK- on control bus 13). If external, the instruction word is received back via the data bus D from the addressed location in the memory 11. This instruction is executed in the next machine cycle (of length of 200 ns defined by a 20 MHz clock or crystal X1, X2) while a new instruction is being fetched; execution of an instruction may include accessing the on-chip RAM 15 for an operand, or writing a result into data RAM 15, and an arithmetic or logic operation in ALU.

In the example to be described in detail, a 12-bit instruction address applied internally to ROM 14 or externally to the RA bus directly addresses $2^{12}$ or 4K words of program instruction or constants in ROM 14 and memory 11. When reading from memory 11, a DEN- (data bus enable bar) command is asserted on control bus 13. It is also possible to write into the memory 11, and for this purpose a WE- (write enable bar) command is asserted by the device 10 on one of the control bus lines 13; the memory 11 may contain read/write memory devices in some or all of the address space, so the WE- command permits a write function.

The I/O devices 12 are addressed as ports; this interface to external devices 12 is accomplished using the address and data busses RA and D and control bus 13, but the I/O devices 12 do not occupy locations in the logical address space like the memory 11. This is in contrast to conventional memory-mapped I/O.

Data input/output via I/O or peripherals 12 employs a 3-bit field RAp from the bus RA to select one of eight 16-bit ports PO-P in peripheral circuitry 12. Each port can be defined as either input or output by DEN- or WE-, so in effect these are sixteen 16-bit parts, eight in and eight out. The selected 16-bit port is addressed by RAp and DEN- or WE-, then accessed for read or write via the bus D. This operation uses one of the two instructions IN or OUT; on the control bus 13, WE is active for write or OUT, or DEN- is active for read or IN. A ROM clock RCKLis active on control bus 13 on every machine cycle except when either DEN- or WE- is active; that is, the memory 11 is activated by RCLK- for possible instruction word access from off-chip in each machine cycle, but if accessing peripheral 12 using DEN- or WEthen the RCLK- does not occur.

The Microcomputer Chip

Figure 2B:
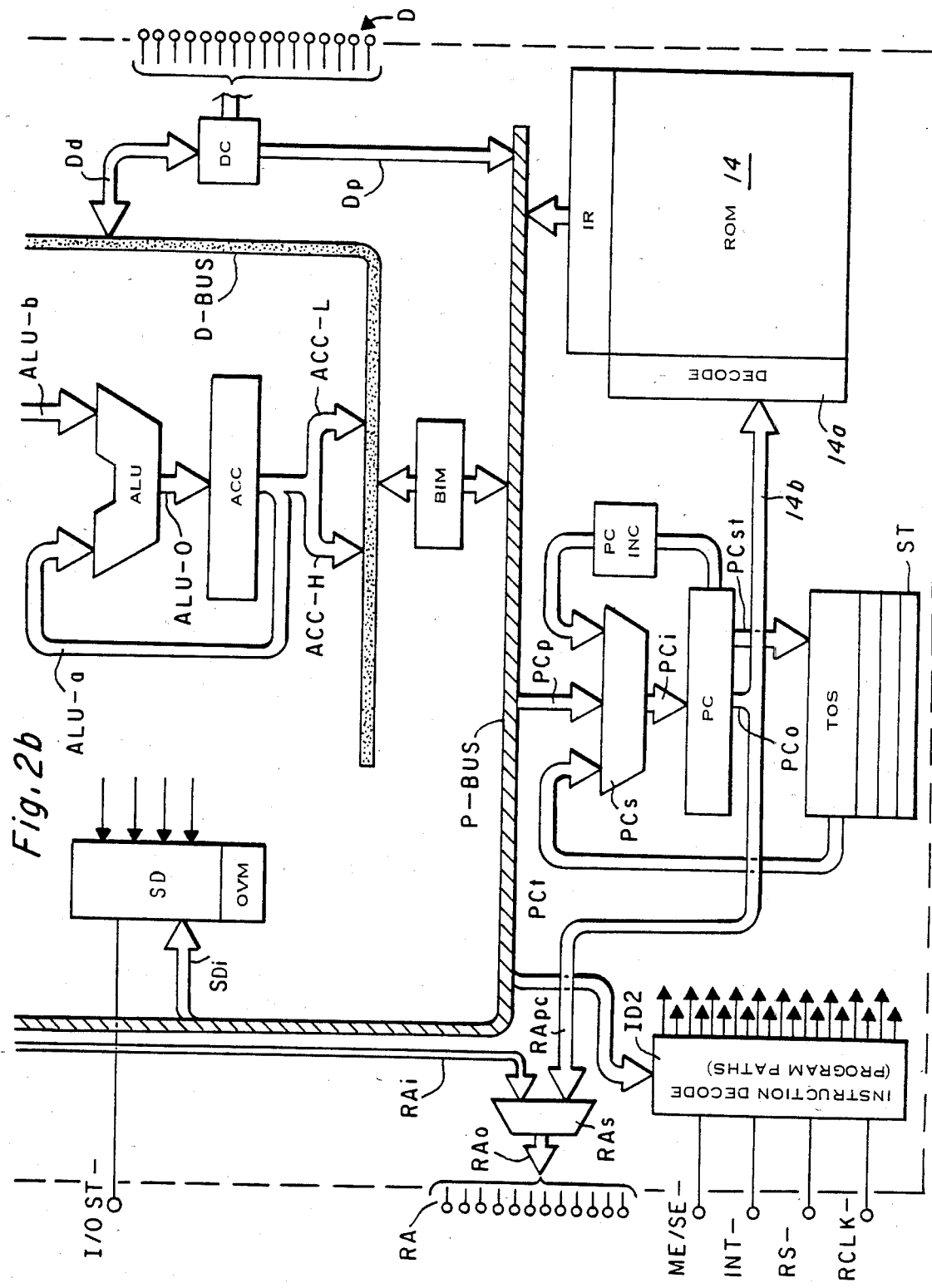

The internal architecture of the microcomputer 10 is shown in a detailed block diagram in FIGS. 2 and 2b. This device is a single-chip semiconductor integrated circuit mounted in a standard 40-pin dual-in-line package or a chip carrier. Sixteeen pins or terminals of the package are needed for the 16-bit data bus D, twelve are used for the address bus RA and the remaining terminals are used for the power supply Vdd and Vss, the crystal X1, X2, and the control bus 13.

In addition to the program and data memory 14 and 15, the microcomputer 10 contains a central processing unit or CPU for the system of FIG. 1, and this CPU includes a 32-bit arithmetic/logic unit or ALU, a 32-bit accumulator Acc to hold operands and results, multiplier M separate from the ALU, a shifter S which is one input to the ALU, status or flag decode SD, and an instruciton decoder ID1 which receives the current instruction word and generates the control bits for the CPU and data memory portions of the device 10.

The program memory 14 has associated with it a program counter PC to hold the instruction address used to access the ROM 14 or sent out on bus RA to the memory 11, an instruction register IR to receive the instruction word from ROM 14, a stack ST to save program memory addresses, and an instruction decoder ID2 which receives the current instruction word and generates control bits for the program memory portion of the microcomputer. The instruction decoders IDj and ID2 of course may be combined into one larger control ROM, or indeed split inot smaller PLAs or random logic.

Associated with the data memory 15 are two auxiliary address registers AR0 and AR1 for the data memory 15, a page register ARP to select between the registers AR0 and AR1 for use as the data memory address, and a data page buffer DP to hold certain bits of the data memory address.

The CPU is oriented around two internal busses, a 16-bit program bus (P-Bus) and a 16-bit data bus (D-Bus). Program access and data access can thus occur simultaneously, and the address spaces are separate. The microcomputer is thus of the Harvard architecture, although a bus interchange module BIM permits loading the program counter PC from Acc, for example, or accessing ROM 14 for constants via P-Bus, BIM and D-Bus.

The two major requirements for a signal processing microcomputer are high speed arithmetic and flexibility. Performance is achieved by using separate, principally on-chip program and data memories 14 and 15, a large single accumulator Acc and a parallel multiplier M. A special purpose operation, data move, is defined within the data memory 15 which further enhances the performance in convolution operations. Flexibility has been achieved by defining an instruction set as will be described with reference to Table A, incorporating memory expansion and a single level of interrupt.

The device can be configured with, for example, less than 2K or $2^{11}$ words of on-chip program memory 14 yet the architecture allows for memory expansion up to 4K or $2^{12}$ words by the addition of external program memory in the memory 11. In addition, a separate mode allows the device 10 to be configured as a system emulation device; in this "system emulator" mode, the entire 4K memory space is external and the ROM 14 is not used.

The CPU

The arithmetic/logic unit or ALU consists of thirty-two parallel stages, each separate stage performing an arithmetic or logic function on its two input bits and producing a one-bit output and carry/borrow. The particular function performed on data passing through the ALU is defined by the current 16-bit instruction word in IR which is applied by the program bus P-Bus to an instruction decoder ID1. The ALU has two 32-bit data inputs ALU-a and ALU-b, and a 32-bit data output ALU-o to accumulator Acc. The ALU-a input is always from the accumulator Acc and the ALU-b input is always either from the shifter S or from a 32-bit product register P in the multiplier M. The source of the ALU-b input is defined by an input select circuit ALU-s which selects from these two alternatives, based upon the contents of the current instruction word, i.e., the outputs #C of the decoder ID1. The shifter S receives a 16-bit input Si from D-Bus and produces a 32-bit output So which is the input Si shifted from zero to fifteen places to the left. Left-shifted data is zero-filled, i.e., all right-hand bit positions are filled with zeros when data is shifted out to the left. A unique feature is that the high-order bit is sign extended during shift operations. The ALU operates in twos-complement. The shifter S includes a shift control Sc loaded with a four-bit value from P-Bus via lines Sp so an arithmetic instruction can directly define the number of bits shifted in the path from D-Bus to the ALU-b input.

Program Memory Addressing

The program memory 14 is a ROM which is partitioned X16 to produce a 16-bit output to instruction register IR, and this ROM employs a decoder 14a which selects one 16-bit instruction word based on an 11-bit or 12-bit address on input lines 14b. In the example embodiment, the ROM 14 contains less than 2K words, so an 11-bit address can be used, but the on-chip program memory could be expanded to 4K with a 12-bit address. The circuit of the ROM 14 is expecially adapted for fast access as will be explained. The address input 14b is received from the program counter PC wich is a 12-bit register containing the address of the instruction following the one being executed. That is, at the time when the control bits #C are valid at the outputs of the instruction decoders ID1 and ID2 for one instruction; PC contains the address of the next instruction. After an address in PC goes into decoder 14a to read the next instruction from ROM 14 into IR, the program counter PC is incremented via PCinc in preparation for another instruction fetch; i.e. PC is self incrementing under control of a #C control bit from ID2. The output PCo from the program counter PC is also applied via lines RApc and selector RAs (and output buffers not shown) to the external RA but via output lines RAo and twelve output pins of the microcomputer device. The RA bus (RA0 through RA11) contains the PC output via RApc when the selector RAs is in one mode, or contains the 3-bit port address input RAi when executing I/O instructions IN and OUT. Whenever the address in PC is above the highest address in ROM 14, off-chip program addressing to memory 11 is assumed; however, the device is designed to operate principally with the on-chip ROM 14, so for many uses of the device off-chip fetches for program instructions would never be needed. The program counter PC may be loaded via input PCi and selector PCs from the P-Bus for branch or call instructions, or loaded from the accumulator Acc via Acc-L, D-Bus, BIM, P-Bus, PCp and PCi in a "call accumulator" CALLA instruction or table-read and table-write.

The register stack ST is used for saving the contents of PC during subroutine and interrupt calls. In the illustrated embodiment, the stack ST contains four 12-bit registers constructed as a first-in, last-out push-down stack, although a larger or smaller number of registers could be used. The current contents of PC are saved by "pushing" onto the top-of-stack register TOS via lines PCst. Successive CALL instructions will keep pushing the current contents of PC onto TOS as the prior contents are shifted down, so up to four nested subroutines can be accomodated. A subroutine is terminated by execution of a return instruction RET which "pops" the stack, returning the contents of TOS to PC via lines PCt, selector PCs and input PCi, allowing the program to continue from the point it had reached prior to the last call or interrupt. When TOS is popped, the addresses in lower registers of ST move up one position. Each subroutine, initiated by a call instruction or an interrupt, must be terminated by a RET instruction.

In an example embodiment, the ROM 14 contains 1536 words, so the remainder of the 4K program address space, 2560 words, is off-chip in the memory 11. When the memory expansion control pin ME/SE- is high, at logic 1, the device interprets any program address in PC in the 0- to 1535 range as being an on-chip address for the ROM 14, and any address in the 1536-4095 range as being an off-chip address so that the PC contents are sent out via RApc and RAo to the RA bus. An output strobe RCLK- generated by the decoder ID2 for every machine state enables the external memory 11 (except when IN or OUT instructions are being executed). When off-chip program memory 11 is accessed, the instruction word read from memory 11 is applied to the external bus D and thus to the internal P-Bus via input/output control DC and lines Dp; this is a 16-bit instruction and, like the output of ROM 14 via IR, it is loaded into decoders ID1 and ID2 for execution, or 12-bits are loaded into PC via PCp, or otherwise used just as an on-chip instruction fetch.

When the ME/SE- pin is at zero the device enters the systems emulator mode wherein the entire 4K program address space is off-chip, so all PC addresses are applied to the RA bus via RApc and RAo. This mode is necessary when a user is developing systems or programs, prior to arriving at a final version of code for the ROM 14. That is, the microcomputer 10 can operate with no code permanently programmed into the ROM so that new programs (stored in RAM or EPROM in the memmory 11) can be tested and debugged, then when the final code is extablished the chips 10 are produced in large volume with this code mask-programmed into the ROM 14.

In either mode, the first two program addresses 0000 and 0001 are used for the reset function. When the reset pin RS- is brought low, an address of all zeros is forced into the program counter PC, as will be explained. Also, the third address is reserved for an interrupt vector; when the INT- pin is brought low, an address of 0002 is forced into PC to begin an interrupt routine.

Data Memory Addressing

The data memory 15 in the example embodiment contains 144 16-bit words, and so an 8-bit address is needed on address input 15a to the RAM address decoder 15b. However, the RAM 15 may be constructed with up to 512 words, requiring a 9-bit address, so the addressing arrangement will be described in terms of address bits which are unused in some embodiments. Each 128 word block of the RAM 15 is considered to be a page, so a 7-bit address field in an instruction word from program memory 14 on P-Bus via input 15c is used to directly address up to 128 words of data memory 15, within a page, and the page is selected by a data poage buffer DP. Alternatively, for indirect addressing; two auxiliary registers AR0 and AR1 are employed in the example embodiment; however, up to eight of these 16-bit auxiliary registers may be used, with the particular one currently being used as the source of the indirect address for the RAM 15 being defined by the auxiliary register pointer ARP. With two registers AR0 and AR1, the pointer ARP is only one bit, but for an embodiment with eight auxiliary registers the pointer ARP is a 3-bit register. The 16-bit auxiliary registers AR0 and AR1 are under control of indirect-address instructions, or store, load or modify auxiliary register instructions SAR, LAR, and MAR, as will be described. Nine-bit addresses from the low-order parts of the auxiliary registers may be applied to the address input 15a via selector 15d, lines 15e, selector 15f, and lines 15g, the paths being defined by control bits #C from ID1. When one of the auxiliary registers is to be the source of the RAM address, the selector 15d uses the value on lines 15e as the address input 15a, whereas if the P-Bus is to be the source of the RAM address the selector 15d uses a 7-bit address from input 15c and a 1-bit (expandable to 3-bit or 4-bit) page address from the data page register DP. The selector 15f is controlled by the pointer ARP which is loaded from P-Bus as defined by an instruction. The auxiliary registers are used for indirect addressing wherein an instruction need not contain a complete address for RAM 15 but instead merely specifies that an auxiliary register is to be used for this address; such instructions can also specify increment or decrement for the auxiliary register selected, in which case the nine LSBs of AR0 or AR1 are changed by +1 or −1 via paths Inc. The auxiliary registers may be thus used as loop counters. The auxiliary registers are accessed by the D-Bus via lines ARio so these registers may be used as miscellaneous working registers, or may be initially loaded to begin a loop count.

The data memory 15 is accessed using the D-Bus and an input/output circuit 15i, via lines 15j. Construction of the data memory is such that a data move wholly within the RAM 15 is permitted, according to an important feature of the microcomputer 10. Under instruction control, the data at one address can be moved to the next higher location within one machine cycle without using the ALU or D-Bus. Thus during an add, for example, the accessed data can be also moved to the next higher address.

Input/Output Functions

Input and output of data from the microcomputer chip 10 uses the data bus D and two of the lines of the control bus 13, these being data enable bar DE- and write enable bar WE-. Two instructions, IN and OUT, are employed for the data input and output functions. The external data bus D is coupled to the internal data bus D-Bus by the input/output control and data buffers DC and lines D1. The output buffers in DC are tri-state, so the output to data bus D from DC is always placed in a high impedence state except when OUT is being executed; to this end, one of the controls #C from the instruction decode ID1 sets the output buffers in high impdence state whenever OUT is not decoded. When the instruction IN is present, the control DC activates sixteen input buffers, so the external data bus D is coupled to the internal D-Bus via DC and lines Dd for data input. When the OUT instruction is decoded, a control #C from ID1 activates output buffers in DC so the internal D-Bus is coupled via Dd and DC to the external bus D.

Execution of an IN instructions will also generate a data enable DEN- strobe on line 13a from ID1, and will couple the D-Bus to the RAM 15 via 15i and 15j, so the data from external will be entered into on-chip data memory. The intended uses of the microcomputer as a signal processor require hundreds or thousands of accesses to RAM 15 for every off-chip reference. That is, a value will be fetched from off-chip then convolution or like operations performed using this new value and other data in the RAM 15, so thousands of instruction executions will transpire before another off-chip reference is needed. For this reason, the architecture favors internal data manipulation over off-chip data access.

Execution of an OUT instruction causes generation of an off-chip write enable WE- strobe on line 13b from ID1 and outputs data from RAM 15 via 15i and 15j, D-Bus, lines Dd and buffer DC to the external bus D. Referring to FIG. 1, this data may be written into one of the ports P0–P7 (selected by the 3-bit RAi value) in the peripherals 12.

Implicit in both the IN and OUT instructions is a 3-bit port address on lines RAi from ID1. This address is multiplexed onto the three LSBs (RA9–RA11) of the external address bus RA via selector RAs. Up to eight peripherals may thus be addressed. The remaining high order bits of the RA bus outputs are held at logic zero during these instructions.

System Timing

Figure 3:
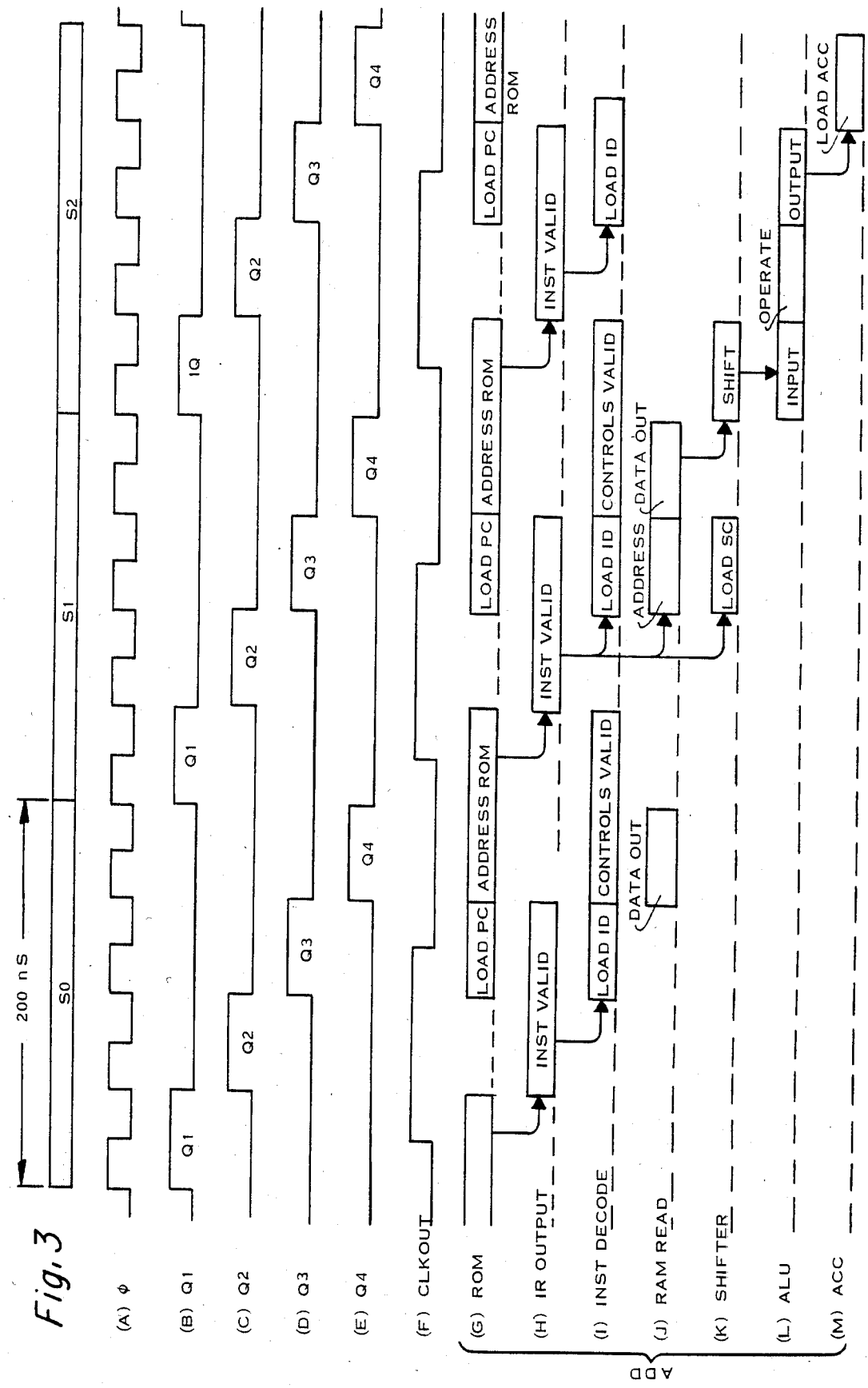
FIGS. 3a–3o are timing diagrams showing voltage or even vs. time in the operation of the microcomputer of FIGS. 2a and 2b.

Referring to FIG. 3a et seq the timing of the system of FIG. 1 and the CPU chip of FIG. 2 is illustrated in a sequence of voltage vs. time waveforms or event vs. time diagrams. The chip 10 includes a clock generator 17 which has two external pins X1 and X2 to which a crystal (or external generator) is connected. The basic crystal frequency is up to 20 MHz and is represented by a clock Φ of FIG. 3a. This clock Φ has a period of 50 ns, minimum, and is used to generate four quarter-cycle clocks Q1, Q2, Q3 and Q4 seen in FIGS. 3b–3e, providing the basic internal timing for the microcomputer chip 10. A set of four quarter cycle clocks Q1 to Q4 defines one machine state time of 200 ns, minimum; the states are referred to as S0, S1, S2, in FIG. 3. The clock generator 17 produces an output CLKOUT, FIG. 3f, on one of the control bus lines 13. CLKOUT has the same period as Q1, but 50% duty cycle and beginning at the midpoint of Q1. This output is used for timing or synchronizing external elements of the system of FIG. 1.

Internally, the microcomputer 10 executes one instruction per state time for most types of instructions, so five million instructions per second are executed at 20 MHz clock rate. Of course, some instructions such as input/output, branch, call or table look-up require two or three state times. Assuming a sequence of single-state instructions such as add, load, store, etc., a new address is loaded into PC during each Q3 as seen in FIG. 3g, then the ROM 14 is addressed during Q4 and Q1 so an instruction word output is produced from IR onto P-Bus valid in the next Q2 and continuing through Q3, as seen in FIG. 3h. The ROM 14 access time is thus about 100 ns. If an external instruction fetch from memory 11 is used, the same access time applies. The instruction decoders ID1 and ID2 receive the instruction word from P-Bus during Q3 as seen in FIG. 3i, and most of the decoder outputs #C are valid during Q1, although some fast controls are available in Q4. For direct addressing of the RAM, the address on bit-9 to bit-15 of P-Bus is immediately gated into the RAM decoder 15b when P-Bus becomes valid, but in either direct or indirect the RAM address is valid by the beginning of Q3 as seen in FIG. 3j. For RAM read, the data output via 15j to D-Bus is valid on Q4, FIG. 3j, and this data passes through the shifter S, FIG. 3k, and is available as an ALU input during Q1, FIG. 3l. The ALU controls #C are valid in Q2 and the ALU output ALU-o is available during Q3. The accumulator Acc is loaded from ALU in Q4, FIG. 3m, then saturated in the next Q1.

It is thus seen that an ADD instruction, for example, for which fetch began at Q3 of the S0 state in FIGS. 3a–3m, will be completed, i.e., the result loaded into Acc, in Q4 of state S2, then the saturated Acc available in Q1 of state S3 could be loaded to D-Bus in Q2. There is substantial overlap of instruction execution. A new instruction fetch begins during Q3 of each state time for one-state instructions, so execution of two more instructions may have begun before one is finished.

Not shown in FIGS. 3a–3m is the write-RAM function. The RAM 15 is always written into during Q2. Addressing the RAM is always during Q3, however. Thus, an instruction such as "store accumulator low" SACL is illustrated in FIGS. 3n and 3o. The RAM address is received from the instruction register via P-Bus on Q3 of S1 (assuming the SACL instruction was fetched beginning at Q3 of S0), and the write will not occur until Q2 of state S2. During the read slot, Q4 of S1, a refresh occurs for the addressed row of the RAM, then the same address stays until Q2 of state S2 for the write. The D-Bus is loaded from Acc during this same Q2, see FIG. 3n.

If the accumulator must perform the saturate function in the overflow mode, i.e., OVM set to 1, this will be performed after the load accumulator function of FIG. 3m. That is, for the ADD instruction of FIGS. 3a–3m, the Acc is saturated during Q1 if the next state S3, so that when the accumulator is accessed by the following instruction it will be available to load the D-Bus on Q2.

When an instruction uses the data move function within the RAM 15, the move operation occurs during Q1 as illustrated in FIG. 3o. Also, if the increment loop counter function is performed for the auxiliary registers AR0 or AR1, the increment (or decrement) is executed in Q1. The T register, auxiliary registers AR0 or AR1, ARP latch, DP register and stack ST registers are each loaded during Q2 of any state time if these functions are included in the current instruction.

The bus interchange module BIM always executes a transfer from D-Bus to P-Bus beginning in Q2, if this function is defined by the instruction. The transfer from P-Bus to D-Bus by BIM is begun during Q4. The D-Bus is precharged on Q3 of every cycle, so no data can carry over on D-Bus through Q3 of any state, nor can data be loaded to or from D-Bus during Q3.

The program counter PC is incremented by the PCinc path during Q3 of each state time. That is, the load PC function of FIG. 3g is the incremented value just generated.

The Chip Layout

Figure 4:
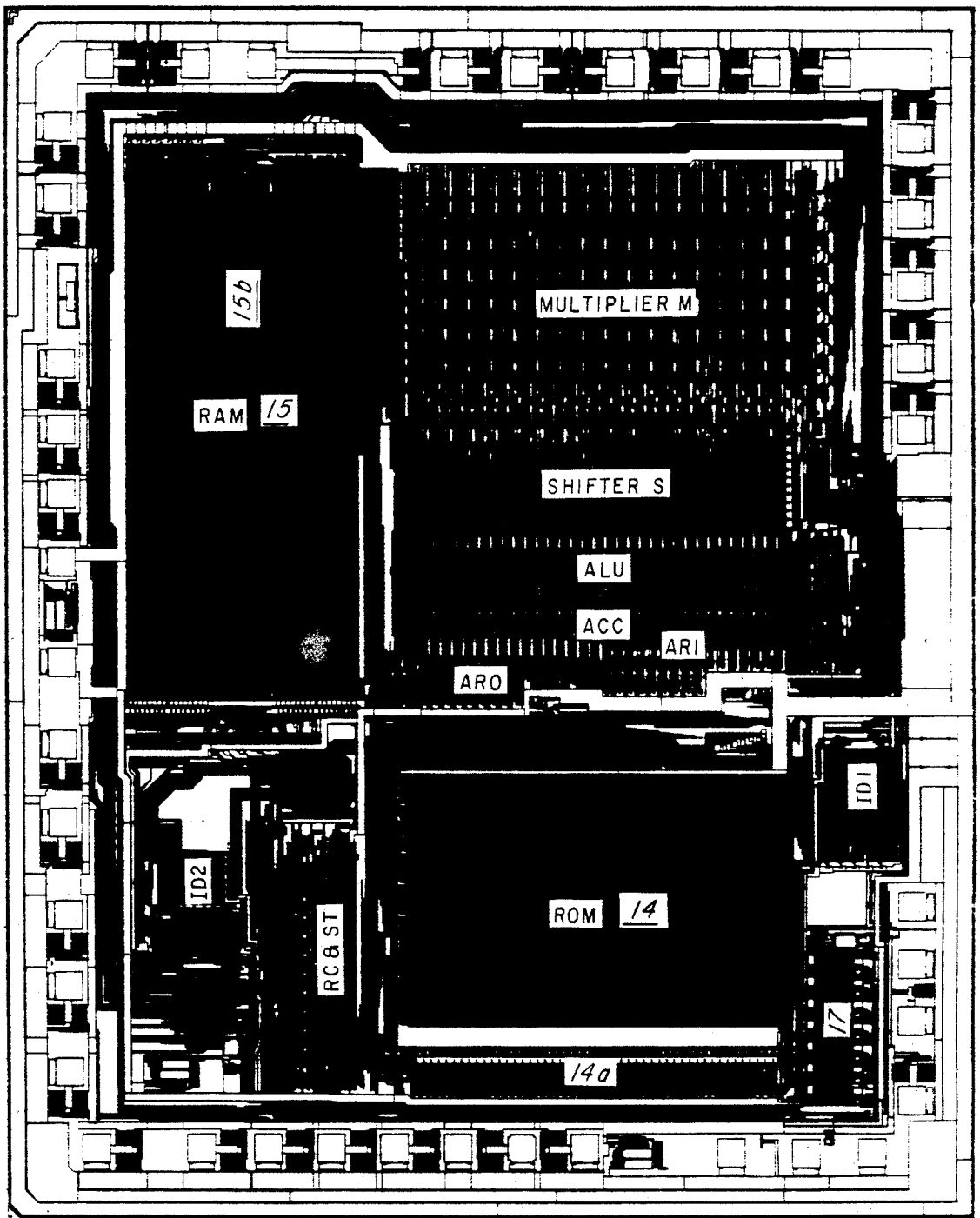
FIG. 4 is a greatly enlarged plan view of a semiconductor chip containing the microcomputer of FIGS. 2a and 2b, showing the physical layout of the various parts of the device.

In FIG. 4, the microcomputer 10 of FIGS. 1 and 2 is illustrated in chip layout form. This is a top view of an MOS/LSI chip which is about 150 mils on a side. A major part of the area of the chip 10 is occupied by the memory including the ROM 14 and RAM 15 with their address decoders, and by the 16×16 multiplier M.

The ROM 14 has associated with it an X address decoder 14x and a separate Y address decoder 14y for instruction word output; twelve address bits are used to define one of up to 4096 16-bit words in the ROM 14, although in this example only 1536 words are on-chip.

The RAM 15 has an X address decoder 15bx which selects 1-of-144 row lines, and a Y address decoder 15by which select 1-of-2 column lines, so only eight bits are needed for the RAM select in this embodiment (eight bits could accomodate a 256 word RAM).

The busses RA and D have twelve and sixteen bonding pads on the chip (total of twenty-eight) for connection to external, and the areas of the chip around these bonding pads seen in FIG. 4 are occupied by the buffers used for the ports. It will be noted that the RA bus is only used for output, so only output buffers are needed for this port, while the D-Bus requires tri-state output buffers as well as input buffers.

The Test Control

The microcomputer 10 has two test modes for making tests of manufactured chips to find out if all internal circuitry is functional and within specifications. Also, if problems exist, the test modes aid in isolating the problems. The chip contains 55,000 transistors, very few of which are directly accessable, and any one of which could cause the microcomputer to fail under some conditions. The test modes should be difficult to enter after the system has been constructed because the microcomputer might be placed in an unwanted condition inadvertently, but yet the test modes should be easily initiated without extra pins, etc., when in the manufacturing or assembly cycle. This objective is usually accomplished by using overvoltage on dual-function pins, but heretofore the circuitry used has been unreliable when process variations cause wide ranges in threshold voltages or the like. Thus, the circuit of FIG. 5o is used for control of the test modes.

Referring to FIG. 5o, a circuit connected to the I/O ST- pin generates a branch or not branch signal to the status decoder SD in normal operation, depending upon logic 0 or logic 1 (+5 v) on this external pin. When this pin is raised to an overvoltage, +10 v for example, the test mode is signalled, however. The path for normal operation includes a Schmidt trigger IOa with output coupled to one input of a bistable latch IOb through a transistor IOc clocked on Q3. The clock Q3 on the other input will cause both outputs to go low, then when Q3 ends the input via IOc stays high and so the latch goes to one state. The latch output drives an output node IOd by a transistor IOe, and the inverted output on line IO is taken from this node. On Q3 of each cycle the I/O ST -pin is interrogated by discharging the node IOd via transistor IOf and coupling Q3 to one input of the latch and the Schmidt output to the other. When Q3 goes low, the node IOd stays low if transistor IOe is off, or goes high if IOe is on, i.e., depending on the state of the latch IOb. When the I/O ST- pin is high, the Schmidt output is low, and Q3 causes the latch IOb to flip to the condition with the voltage to transistor IOe high, node IOd high, and output IOo low, indicating no branch to status decode SD if a BIOZ instruction is being executed; this indication is valid from the end of Q3 to the beginning of the next Q3. If I/O ST- pin is low, both inputs to latch IOb are nearly Vdd, during Q3 but after Q3 the 1 trapped on one input causes the latch to flip the other way, producing a valid or branch signal on line IO.

The test mode control, also connected to the I/O ST- pin, uses a latch IOg which is unbalanced by capacitors IOh of unequal size at its inputs. These inputs are connected to nodes IOi and IOj in the high-voltage detector circuit. These nodes are precharged to Vdd-Vt on Q2 by transistors IOk, then discharged in a race condition by transistors IOm on Q3. The I/O ST- pin is connected to transistor IOn in one path, and Vdd to the gate of transistor IOp in the other. If an overvoltage of at least about Vdd+3 is on the I/O ST- pin, transistor IOn conducts heavier than IOp, the node IOj tends to stay high longer during Q3 and the latch IOg flips to a state with output IOq low, node IOr low, and test control IOt high, indicating test mode. If the voltage on the test pin is a logic 1, the two paths IOn and IOp will conduct about the same, and the larger capacitor IOh on the IOi node causes the latch IOg to flip the other way because this latch input discharges slower, and output IOs leaves the node IOr high and output IOt low, indicating no test condition. A zero on I/O ST -pin gives the same IOt low condition as a one on I/O ST-.

A major advantage of the overvoltage detector described above is that it is keyed to Vdd, so if Vdd changes the trip level will still be above Vdd, and also if threshold voltages Vt change with process variations the Vt of both transistors IOn and IOp will change the same, so the circuit will still operate properly.

Figure 5:
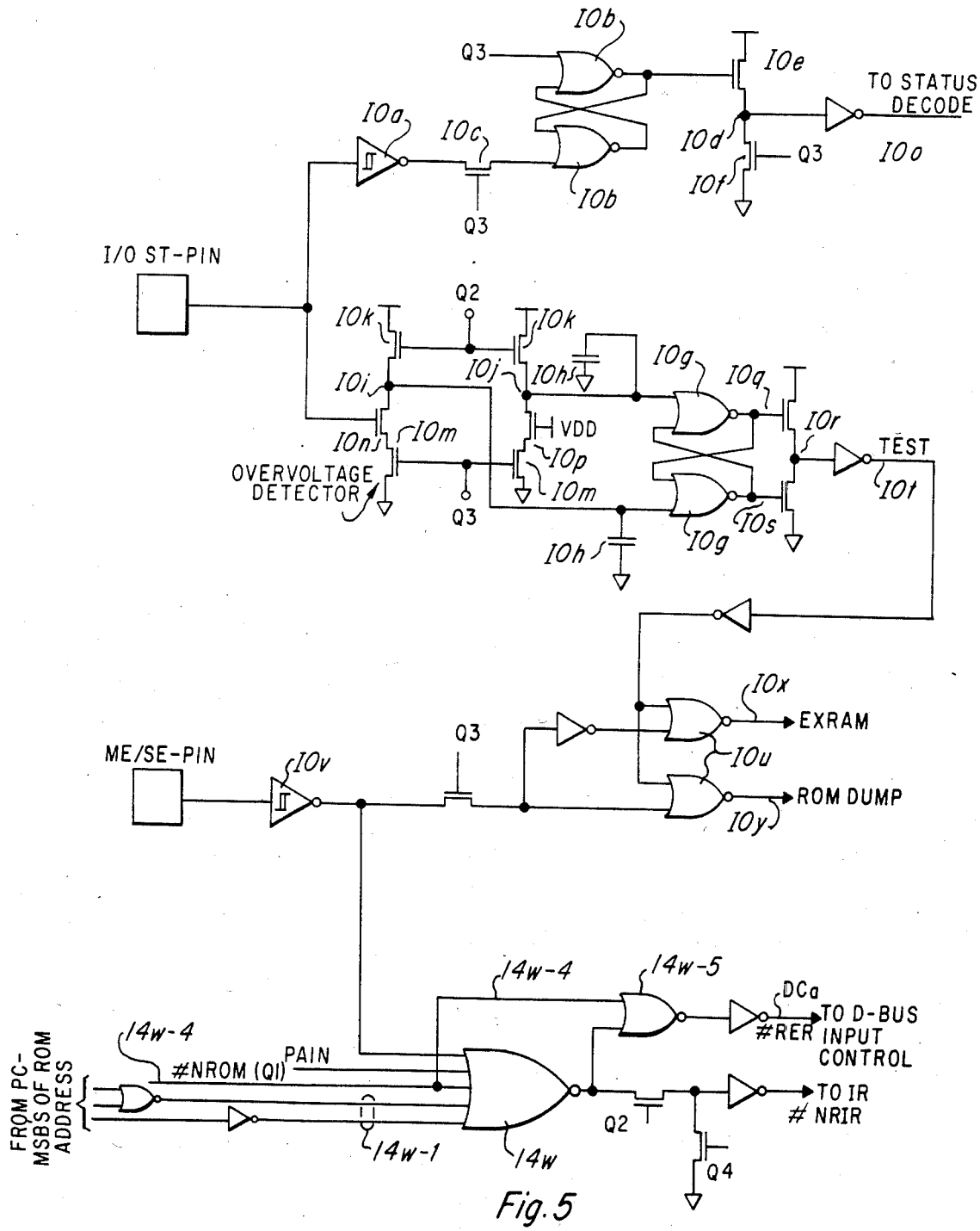
FIG. 5 is an are electrical schematic diagram of particular circuits according to the invention in the microcomputer device of FIGS. 2a and 2b.

The logic circuitry of FIG. 5 generates the #NRIR command to ROM 14 by a multi-input gate 14w. INputs 14w-1 are the MSB bits from the PC and detect that the address is outside the range on on-chip ROM 14 so the address must be off-chip; this prevents #NRIR from going active-low, and instead produces a command #RER, read external ROM, going to the data I/O control DC via line DCa. Also, an input 14w-2 from the ME/SE- pin causes the same function; the internal ROM is disabled, and external program fetch is implemented. An interrupt conduction PAIN causes this same condition when input 14w-3 is high. An input 14w-4 to the gate 14w is also an input to gate 14w-5 and disables both internal and external ROM commands #NRIR and #RER; this is used in instructions which employ the BIM and P-Bus for transfer of the contents of Acc to PC, such as CALA, TBLR and TBLW. The #NROM command on input 14w-4 is an output of the instruction decoders IR1 or IR2.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A level detector circuit for a microcomputer input terminal or the like, comprising:
   a bistable latch having first and second unbalanced input nodes and an output; said input nodes being unbalanced by impedance means of unequal value connected to the nodes;
   means for precharging said first and second input nodes to equal voltage;
   a first transistor having a current path connecting said first input node to ground and having a gate connected to said input terminal;
   a second transistor having a current path connecting said second input node to ground and having a gate connected to a first logic level;
   and means for gating said current paths of the first and second transistors to a conductive condition after said means for precharging has precharged said input nodes, whereby said bistable latch flips to one stable state if the input terminal is at a voltage substantially above said first logic level, or flips to another stable state if the input terminal is at about said first logic level or below.

2. A circuit according to claim 1 wherein said first and second transistors are insulated gate field effect transistors and the current paths are source-to-drain paths.

3. A circuit according to claim 1 wherein said means for precharging comprises a pair of transistors, said pair of transistors having source-to-drain paths connected in series with said current paths of said first and second transistors and a voltage supply, and said pair of transistors having gates connected to a first clock.

4. A circuit according to claim 3 wherein said means for gating comprises a second pair of transistors, said second pair of transistors having source-to-drain paths in series with said current paths of the first and second transistors, and said second pair of transistors having gates connected to a second clock, said second clock occurring after said first clock.

5. A circuit according to claim 4 wherein said impedance means are capacitors of unequal value.

6. A level detector circuit for a microcomputer input terminal or the like, comprising:
   (a) a first bistable latch having first and second unbalanced input nodes and an output; said input nodes being unbalanced by impedance means of unequal value connected to the nodes;
   means for precharging said first and second input nodes to equal voltage;
   a first transistor having a current path connecting said first input node to ground and having a gate connected to said input terminal;
   a second transistor having a current path connecting said second input node to ground and a gate connected to a first logic level;
   and means for gating said current paths of the first and second transistors to a conductive condition after said means for precharging has precharged said input nodes, whereby said latch flips to one stable state if the input terminal is at a voltage substantially above said first logic level, or flips to another stable state if the input terminal is at about said first logic level or below, and
   (b) a second bistable latch having an input connected to said input terminal through a threshold-responsive trigger set at a level above ground and below said first logic level, and having an output,
   whereby said output of the first bistable latch and said output of the second bistable latch together define a three-level detection output.

7. A circuit according to claim 1 wherein said first logic level is a supply voltage, and said means for precharging precharges said first and second input nodes from said supply voltage.

* * * * *